(12) United States Patent
Kumagae et al.

(10) Patent No.: US 7,491,986 B2
(45) Date of Patent: Feb. 17, 2009

(54) SEMICONDUCTOR INTEGRATED CIRCUIT DEVICE

(75) Inventors: Takaaki Kumagae, Osaka (JP); Yasuyuki Okada, Osaka (JP); Masumi Nobata, Osaka (JP)

(73) Assignee: Panasonic Corporation, Osaka (JP)

( * ) Notice: Subject to any disclaimer, the term of this patent is extended or adjusted under 35 U.S.C. 154(b) by 534 days.

(21) Appl. No.: 10/740,684

(22) Filed: Dec. 22, 2003

(65) Prior Publication Data
US 2004/0150007 A1    Aug. 5, 2004

(30) Foreign Application Priority Data
Dec. 25, 2002    (JP)    ............... P.2002-375069

(51) Int. Cl.
    *H01L 27/10*    (2006.01)
(52) U.S. Cl. ............... 257/203; 257/758; 257/784; 257/207; 257/208; 257/E23.179
(58) Field of Classification Search ............ 257/203, 257/758, 784, 207, 208
    See application file for complete search history.

(56) References Cited

U.S. PATENT DOCUMENTS

| | | | | |
|---|---|---|---|---|
| 5,063,429 A | * | 11/1991 | Crafts | ............... 257/203 |
| 5,394,008 A | * | 2/1995 | Ito et al. | ............... 257/666 |
| 5,943,254 A | * | 8/1999 | Bakeman et al. | ............... 365/72 |
| 6,351,405 B1 | | 2/2002 | Lee et al. | |
| 6,538,866 B1 | * | 3/2003 | Hanzawa et al. | ............... 361/91.1 |
| 6,911,683 B2 | * | 6/2005 | Konishi et al. | ............... 257/207 |
| 2003/0234661 A1 | * | 12/2003 | Yamamoto et al. | ............... 324/765 |
| 2004/0101985 A1 | * | 5/2004 | Whetsel et al. | ............... 438/17 |
| 2004/0136128 A1 | * | 7/2004 | Kato | ............... 361/56 |
| 2004/0140860 A1 | * | 7/2004 | Miller | ............... 333/33 |
| 2006/0292713 A1 | * | 12/2006 | Haza et al. | ............... 438/14 |
| 2007/0296441 A1 | * | 12/2007 | Whetsel | ............... 324/763 |

FOREIGN PATENT DOCUMENTS

| | | | |
|---|---|---|---|
| EP | 464751 | * | 1/1992 |
| JP | 59-115540 A | | 7/1984 |
| JP | 62-183124 A | | 8/1987 |
| JP | 3-21042 A | | 1/1991 |
| JP | 5-145015 A | | 6/1993 |
| JP | 5-251562 | | 9/1993 |
| JP | 9-321225 A | | 12/1997 |
| JP | 10-50937 | * | 2/1998 |
| JP | 11-154729 | * | 6/1999 |
| JP | 2001-332692 | * | 11/2001 |
| JP | 2001-337139 | | 12/2001 |
| JP | 2002-16225 A | | 1/2002 |
| JP | 2002-83931 | * | 3/2002 |

* cited by examiner

*Primary Examiner*—A. Sefer
(74) *Attorney, Agent, or Firm*—McDermott Will & Emery LLP

(57) ABSTRACT

A different electric power supply electric power source cell is proposed which includes paths by which electric power source voltages, the electric potentials of which are different from each other, are respectively taken in from the area pad and the probing pad and by which the voltages are supplied to the blocks requiring these electric power source voltages.

5 Claims, 16 Drawing Sheets

SURGE PROTECTION BETWEEN
ELECTRIC POWER SOURCES
① VDD—VSSQ
② VDD—VDDQ

SURGE PROTECTION BETWEEN
ELECTRIC POWER SOURCES
③ VSSQ—VDDQ

SURGE PROTECTION BETWEEN
ELECTRIC POWER SOURCES
① VSS—VSSQ
② VSS—VDDQ

SURGE PROTECTION BETWEEN
ELECTRIC POWER SOURCES
③ VDDQ—VSSQ

SEMICONDUCTOR INTEGRATED CIRCUIT DEVICE

The present application is based on Japanese Patent Application No. 2002-375069, which is incorporated herein by reference.

BACKGROUND OF THE INVENTION

1. Field of the Invention

The present invention relates to a semiconductor integrated circuit device. More particularly, the present invention relates to a structure of the input and output circuit cell.

2. Description of the Related Art

As shown in FIG. 7, which is a view showing an outline of the arrangement of the flip chip LSI, the flip chip LSI includes: probing pads 2 arranged in the periphery of the chip; and LSI peripheral circuit elements 9 such as input and output circuit cells 3 arranged in the inner region of the chip, electric power supply cells 4 for the input and output circuit, and electric power supply cells 6 for the LSI inner logic circuit for supplying an electric power source voltage to the LSI inner logic circuit 5, wherein these LSI peripheral circuit elements 9 are arranged at a predetermined pitch, and the LSI inner logic circuit 5 is arranged in the inner region of the LSI peripheral circuit elements 9.

Further, on the surface of the chip 1, the air pads 7 connected to the electric power source wiring of the flip chip package and the rearrangement wiring 8 for connecting the area pads 7 to the LSI are arranged. The electric power source lines for supplying an electric power source voltage to drive these circuit elements are an electric power source line 10 for the LSI peripheral circuit, which is arranged in an upper portion of the LSI peripheral circuit element 9, and an electric power source line 7 for the LSI inner logic circuit arranged in the periphery of the LSI inner logic circuit 5, and these electric power source lines are arranged being electrically separate from each other. In this case, a package including a ball grid array (BGA) formed in the stiffener is used for the flip chip package.

An electric power source voltage is supplied to each circuit element in the LSI chip when the device is operated and also when the device is subjected to a product inspection. Concerning the product inspection, there are provided a probing inspection, which is conducted in the wafer stage, and a finished product inspection conducted after the completion of assembling. In the case of the finished product inspection conducted after the completion of assembling, the product is operated by electric power, the frequency of which is the same as the actually used frequency, and the input and output time of a signal is inspected. In this case, for the object of judging the result of making the LSI chip from the viewpoints of the function and performance, it is necessary to supply a sufficiently high intensity of electric power to both the LSI peripheral circuit elements 9 and the LSI inner logic circuit 5.

However, as the scale of LSI has been recently enlarged, IR drop of the electric power source causes a problem. In order to reduce IR drop, the following method is adopted. An electric power source voltage, which is supplied from the flip chip package, is supplied to the LSI peripheral circuit element 9 and the LSI inner logic circuit 5 via the area pad 7 arranged on the rearrangement wiring layer located on an upper face of the metal wiring layer of the LSI chip.

On the other hand, in order to judge the result of the manufacturing process, the probing inspection is conducted before mounting. In this probing inspection, in general, DC inspection for inspecting the result of manufacturing a transistor is conducted such as a measurement of an output current of the input and output circuit and a measurement of a leak current. These measurements of measuring electric currents are conducted when the toggle ratio of the inner logic circuit is made to come close to 100% which is called a scan test. In this case, an electric power source voltage supplied from the probing inspection device via the probing pad arranged in the periphery of the LSI is taken into the electric power supply cell and supplied to the LSI peripheral circuit element 9 and the LSI inner logic circuit 5, and the self test is made.

The structure and operation of the electric power source cell 4, which is the peripheral circuit element 9 of the LSI flip chip 1, will be explained together with the area pad 7, the probing pad 2 and the LSI peripheral circuit electric power source line 10 on the LSI peripheral circuit element 9.

FIG. 8 is a view showing an outline of the conventional input and output circuit electric power supply cell. In this case, the input and output circuit electric power supply cell 20 includes: an input and output circuit electric power source VDDQ supply cell 20a; and an input and output circuit electric power source VSSQ supply cell 20b. FIG. 9 is a view showing the input and output circuit electric power source VDDQ supply cell 20a, and FIG. 10 is a sectional view taken on line B-B'. FIG. 11 is a view showing the input and output circuit electric power source VSSQ supply cell, and FIG. 12 is a sectional view taken on line B-B'.

The input and output circuit electric power source VDDQ supply cell 20a is composed of an electric power source input port 21, an electric power source supply port 22, an electric power source wiring 23 and a surge protecting circuit 24 between the electric power sources. The electric power source input port 21 is connected to the probing pad 26 by the wiring 25. Further, the electric power source input port 21 is connected to the area pad 27 on the rearrangement wiring layer, which is located in an upper portion of the LSI chip 1, by the rearrangement wiring 28. The electric power source supply port 22 is connected to the LSI peripheral circuit electric power source line 29 by the electric power source wiring 23 in the cell. The input and output circuit electric power source, which has been inputted from the area pad 27 and the probing pad 26, is supplied from the electric power source input port 21 to the LSI peripheral circuit electric power source line 29, which is arranged on the LSI peripheral circuit element 9, via the electric power source wiring 23 in the cell and the electric power source supply port 22.

FIG. 11 is a view showing an outline of the input and output circuit VSSQ electric power supply cell 20b, and FIG. 12 is a sectional view taken on line B-B'.

In this case, one different point of the input and output circuit VSSQ electric power supply cell 20b from the input and output circuit electric power source VDDQ supply cell 20a is described as follows. In the input and output circuit electric power source VDDQ supply cell 20a, the signal wiring 23 composed of the first layer metal directly reaches the electric power source input port 21 so that it can be arranged from the electric power input port 21 to the electric power source supply port 22. On the other hand, in the input and output circuit VSSQ electric power supply cell 20b, the signal wiring 23 composed of the first layer metal reaches the electric power supply port 22 via the LSI peripheral circuit electric power source line 29 composed of the second layer metal. The other points are the same, and like reference characters are used to indicate like parts.

FIG. 13 is a view showing an outline of the LSI inner logic circuit electric power supply cell. FIG. 14 is a view showing an LSI inner logic circuit VDD or VSS electric power supply cell, and FIG. 15 is a sectional view taken on line A-A'. These views are the same as those described before. The LSI inner logic circuit electric power supply cell 30 is composed of an electric power source input port 31, an electric power source supply port 32, an electric power source wiring 23 and a surge protecting circuit 34 between the electric power sources. The electric power source input port 31 is connected to the probing pad 36 by the wiring 35. Further, the electric power source input port 31 is connected to the area pad 37 on the rearrangement wiring layer, which is located in an upper portion of the LSI chip, by the rearrangement wiring 38. The electric power source supply port 32 is connected to the LSI inner logic circuit electric power source line 39 by the wiring 43. The LSI inner logic circuit electric power source, which has been inputted from the area pad 37 and the probing pad 36, is supplied from the electric power source input port 31 to the LSI inner logic circuit electric power source line 39, which is arranged in the LSI inner logic circuit periphery, via the electric power source wiring 33 in the cell and the electric power source supply port 32.

The electric power supply cell arranged in the conventional LSI peripheral circuit is provided for each type electric power source of the circuit to which the electric power source is supplied such as an input and output circuit or an LSI inner logic circuit.

There is provided a conventional LSI in which an increase in the chip area according to an increase in the number of terminals of LSI is suppressed when an electric power source pad is built in the LSI peripheral circuit element having an empty pad space in which the electrode pad is not arranged. Concerning this conventional LSI, refer to Patent Document 1.

[Patent Document 1]
Unexamined Japanese Patent Publication No. Hei-05-251562

In the case of LSI in which a plurality of input and output circuit cells and electric power supply cells are arranged in the periphery of LSI, data is transmitted from LSI to the external circuit at high speed. Accordingly, there are provided input and output circuits of various standards and electric power source supply circuits of various standards for supplying a reference voltage to the input and output circuits.

However, when a method of transmitting data at high speed, in which the bit width of data is increased, is adopted, the following problems are encountered. The number of the input and output circuit cells is increased. Accordingly, the number of the input and output circuit electric power supply cells for supplying to the input and output circuit cells is increased.

When the components composing LSI are made fine and the ratio of integration is increased and the integrated circuit operates at high speed, electric power consumption in the LSI inner logic circuit is increased. As a result, electric power consumption of the entire LSI is increased, and the number of the necessary LSI inner logic circuit electric power supply cells must be increased in proportion to the electric power consumption.

While LSI is being operated, in order to stabilize operation of the circuit, both the LSI peripheral circuit element and the LSI inner logic circuit must be supplied with a sufficiently high intensity of electric power being protected from a surge in the electric power supply circuit.

When products are inspected, in the case of a finished product inspection or in the case of actually operating the products, the entire circuit elements of LSI including all the input and output circuits are operated. However, in the case of DC inspection of the probing inspection, it is sufficient that a representative cell of the input and output circuit cells is measured, which is based on various interface standards, in the input and output circuit cells arranged in the periphery of LSI. Therefore, different from the finished product inspection, the electric power source cells for supplying electric power to the input and output circuit cells, which are not operated, becomes useless.

In the scan test of the LSI inner logic circuit, it is necessary to instantly operate all the circuits. Therefore, it is necessary to supply a sufficiently high intensity of electric power to the inner logic circuit via the LSI inner logic circuit electric power supply cell. Therefore, it is necessary to provide more electric power supply cells.

However, in general, the number of the LSI inner logic circuit electric power supply cells to be arranged is smaller than that of the input and output circuit electric power supply cells which are arranged by a predetermined ratio with respect to the input and output circuit cells in the periphery of LSI.

In the case of a finished product inspection and also in the case of actually operating the device, these input and output circuit cells 3 take in a signal from the area pad 7 connected to the package. The input and output circuit electric power supply cells 4 take in electric power to be supplied to the input and output circuit cells 3 from the area pad 7 and supply an electric power source voltage to the input and output circuit cells 3 being protected from a surge in the cell.

However, at the time of a probing inspection, these input and output circuit cells 3 are not operated for the following reasons.

(1) The other input and output circuit cells 3 are inspected being represented.

(2) The number of the connection ports with LSI, which the probing inspection device has, is not more than the number of pads of LSI, that is, the device is limited.

Therefore, at the time of the probing inspection, it is unnecessary to supply an electric power source voltage to these input and output circuit cells 3. Therefore, the probing pads connected to the input and output circuit electric power supply cells 4 are not used yet. In this connection, the input and output circuit electric power supply cell 4 itself is necessary for protecting the electric power source from a surge at the time of the finished product inspection. Therefore, it is impossible to get rid of the input and output circuit electric power supply cell 4 for the reason that it is not used in the probing inspection.

In order to enhance the noise resistance property of LSI and in order to reduce an influence given from IR drop, it is an important task to effectively supply electric power to the input and output circuits and the inner logic circuits by using the electric power supply cells, the number of which is limited.

The present invention has been accomplished in view of the above actual circumstances. It is an object of the present invention to provide a semiconductor integrated circuit device in which the number of circuit cells arranged in the periphery of LSI is decreased so as to reduce the chip area.

It is another object of the present invention to enhance the inspection accuracy by increasing the electric power supply paths to the inner logic circuit at the time of the probing inspection and reducing an influence given from IR drop.

SUMMARY OF THE INVENTION

The present invention proposes a different electric power source supply electric power source cell by which an electric power source voltage is taken in from the area pad and also an electric power source voltage, the electric potential of which is different from that of the above voltage, is taken in from the probing pad, and the electric power source voltage is supplied to each circuit block, which requires the electric power source voltage, by a path.

In the case of the conventional chip shown in FIG. 7, at the time of the probing inspection, more electric power supply cells 6 for the inner logic circuit (core) are required. Therefore, an electric power source voltage for the inner logic circuit (core) is taken in from the probing pad 2 connected to the input and output circuit electric power supply cell 4 not used yet so that the number of paths to supply electric power source voltage to the inner logic circuit 5 is increased. Due to the foregoing, the inner logic circuit (core) at the time of the probing inspection can be stabilized, that is, an influence caused by the IR drop can be avoided.

Therefore, instead of the conventional electric power supply cell having paths for taking in the electric power source voltages of the same electric potential from the area pad 7 and the probing pad 2 and supplying the voltages to the circuit blocks and also having a surge protecting circuit, according to the present invention, a different electric power source supply electric power source cell is proposed by which an electric power source voltage is taken in from the area pad and also an electric power source voltage, the electric potential of which is different from that of the above voltage, is taken in from the probing pad, and the electric power source voltage is supplied to each circuit block, which requires the electric power source voltage, by paths. In this structure, the chip area is not increased compared with the chip area of the conventional cell.

When the different electric power supply electric power source cell is used as described above, the following advantages are provided.

(1) Concerning the inner logic circuit (core) electric power sources which is insufficient, it becomes possible to increase the number of the electric power source paths at the time of the probing inspection without increasing the number of the conventional electric power source cells to be arranged. Therefore, it is possible to suppress the IR drop in the LSI inner logic circuit 5.

(2) On the other hand, the number of paths for supplying electric power can be maintained and the number of the input and output circuit electric power supply cells can be decreased. Therefore, in the case of LSI chip, the chip area of which is determined by the arranging width of the input and output circuit electric power supply cells, the chip area can be reduced.

The present invention provides a semiconductor integrated circuit device comprising: a plurality of circuit blocks; and an input and output circuit cell connected to the circuit blocks, wherein the plurality of circuit blocks are connected to different nodes via a common input and output circuit cell.

According to the above constitution, the input and output circuit cell, which must be originally provided for each node, is used in common. Therefore, the number of the input and output circuit cell can be decreased. Accordingly, it is possible to reduce the chip area.

At the time of inspection, since the number of the electric power supply paths can be increased, an influence given by IR drop can be reduced.

For example, these circuit blocks are an LSI inner logic circuit, an LSI peripheral circuit and so forth. In this case, the inner logic circuit electric power is taken in from the probing pad and supplied to the LSI inner logic circuit electric power source line. In addition to that, the input and output circuit electric power is taken in from the area pad and supplied to the LSI peripheral circuit electric power line. In this way, a different electric power supply commonly used electric power supply cell is provided in which a plurality of electric power supply paths, the electric potentials of which are different from each other, are provided and the cell area is the same as that of the single electric power supply cell.

It is preferable that this input and output circuit cell is provided with a surge protecting circuit and a plurality of circuit blocks are connected with each other via the surge protecting circuit. Due to the foregoing, the circuits can be protected from an influence of surge without increasing the chip area.

In the case where the input and output circuit cells are arranged in the periphery of the semiconductor integrated circuit, the number of the input and output circuit cells is restricted, however, according to the present invention, the input and output circuit cells are used in common. Therefore, the number of the cells is not increased.

The above input and output circuit cells are connected to the outside via the first and the second pads. Therefore, according to whether the first pads or the seconds pads are connected to the outside, one of the plurality of circuit blocks is connected to the side corresponding to the node.

According to the above constitution, when the connection is changed over from the outside, an appropriate intensity of electric current can be easily supplied.

The input and output circuit cells are connected to the probing pads used for the probing test and the terminal pads used for the external connection. In the case of an inspection, the input and output circuit cells are connected to the probing pads, so that the probing inspection can be conducted on one of the circuit blocks. In the case of driving, the input and output circuit cells are connected to the terminal pads, so that the other of the circuit blocks can be driven.

Due to the foregoing, it is possible to provide a semiconductor device, the IR drop of which is small even in the case of a probing inspection, without an increase in the chip area.

The present invention provides a semiconductor integrated circuit device, in which the plurality of circuit blocks include an inner logic circuit block of the semiconductor integrated circuit and an input and output circuit block in the periphery, the inner logic circuit block of the semiconductor integrated circuit and the input and output circuit block in the periphery are connected to the probing pad for a probing test and the terminal pad for an external connection via the input and output circuit cell, the inner logic circuit block of the semiconductor integrated circuit and the input and output circuit block in the periphery are connected to the probing pad in the case of inspection and conduct a probing inspection on one of the circuit blocks, and the inner logic circuit block of the semiconductor integrated circuit and the input and output circuit block in the periphery are connected to the terminal pad in the case of driving and drives the inner logic circuit block.

According to the above constitution, the number of the electric power supply paths from the probing pads to the LSI inner logic circuit can be increased in the case of a probing inspection. Therefore, it is possible to reduce an influence given from IR drop in the logic circuit. Accordingly, the probing inspection accuracy can be enhanced.

The present invention provides a semiconductor integrated circuit device, in which the input and output circuit cell includes a multiple layer wiring portion, and the probing pad for a probing test and a terminal pad for an external connection are composed of wiring of different layers.

Due to the above constitution, the occupied area is not increased.

This probing pad is arranged on the chip surface of the semiconductor integrated circuit. The above terminal pad is connected to the inner logic circuit block, which is connected to the input and output circuit cell, via a contact formed on the insulating film covering the probing pad.

According to the above constitution, the occupied area of the chip can be reduced.

In the case where the probing pads are arranged on the surface of the periphery of the semiconductor integrated circuit chip, the chip area can be effectively utilized.

When these terminal pads are composed of bumps which are area pads arranged in the rearrangement wiring formed in the element region of the semiconductor integrated circuit chip, the wiring length can be reduced and the pad area can be sufficiently enlarged.

The present invention provides a semiconductor integrated circuit device, further comprising: an LSI peripheral circuit connected to the first node; and an LSI inner circuit connected to the second node, and electric connections to the first and the second node are made via the first electric power supply wiring and the second electric power supply wiring in the input and output circuit cell.

According to the above constitution, inputting and outputting are conducted on different nodes by the same input and output circuit cell. Therefore, the chip area can be reduced and the operation speed can be reduced.

It is preferable that the semiconductor integrated circuit device is a flip-chip LSI (1), on the surface of which a rearrangement wiring is provided, which is connected to a mounting board (100) in a state of face-down (see FIG. 16).

Due to the above constitution, it is possible to form area pads and mount them with BGA. Therefore, the wiring length can be reduced. In this case, "area pads" means that the input and output pads are arranged not only in the chip periphery but also in the central portion of the chip by the rearrangement wiring.

The present invention provides a semiconductor integrated circuit device, in which the input and output circuit cell is provided with a surge protecting circuit between the electric power sources, and this surge protecting circuit is commonly used between an electric power source for the LSI peripheral circuit and an electric power source for the LSI inner logic circuit.

According to the above constitution, since the surge protecting circuit is used in common, the chip area can be reduced.

DETAILED DESCRIPTION OF THE PREFERRED EMBODIMENTS

An embodiment of LSI chip, in which the different power source commonly used power supply cell of the present invention is used, will be explained as follows. First, the constitution of the cell is shown and then the mode of operation is explained.

Figure 1:
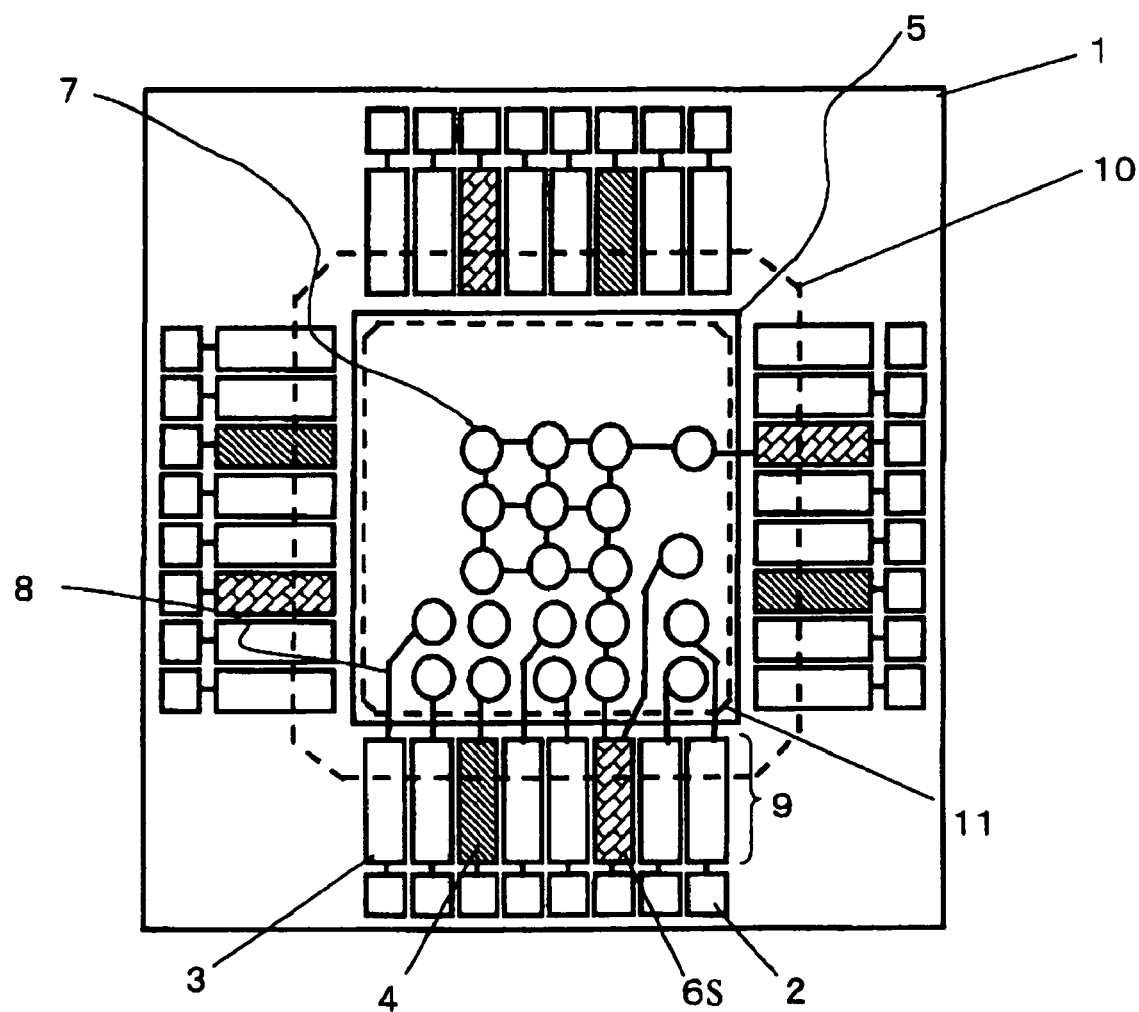
FIG. 1 is a view showing an outline of the flip chip LSI on which the different power source commonly used power supply cell of an embodiment shown is mounted.

As shown in FIG. 1 which is a view showing an outline of this LSI chip 1, the input and output circuit cells are arranged corresponding to the respective probing pads 2 arranged in the periphery of the chip. The different electric power source commonly used supply cell 6S is installed in this input and output circuit cell. The other points are the same as those of the chip of the conventional example shown in FIG. 7. Like reference characters are used to indicate like parts in FIGS. 1 and 7.

Figure 7:
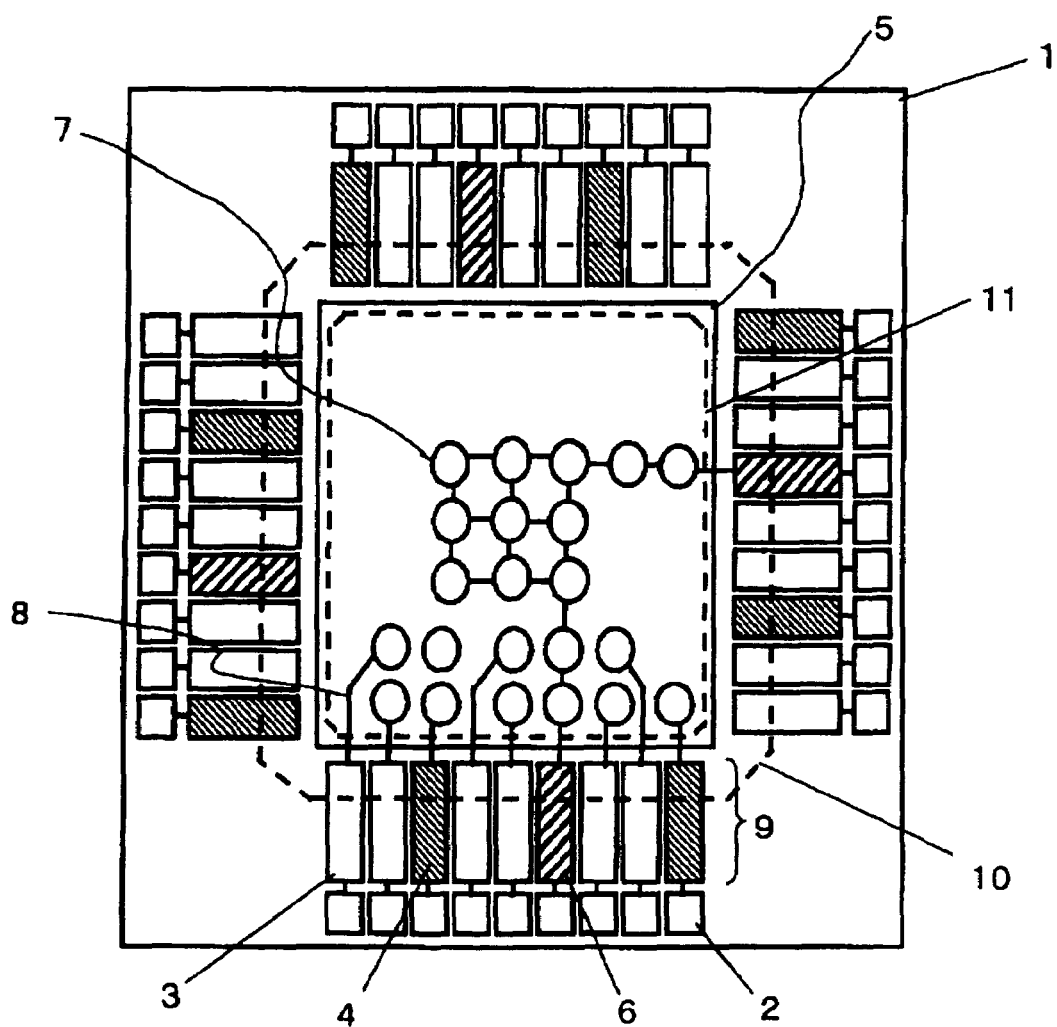
FIG. 7 is a view showing an outline of the conventional flip chip LSI.
Figure 8:
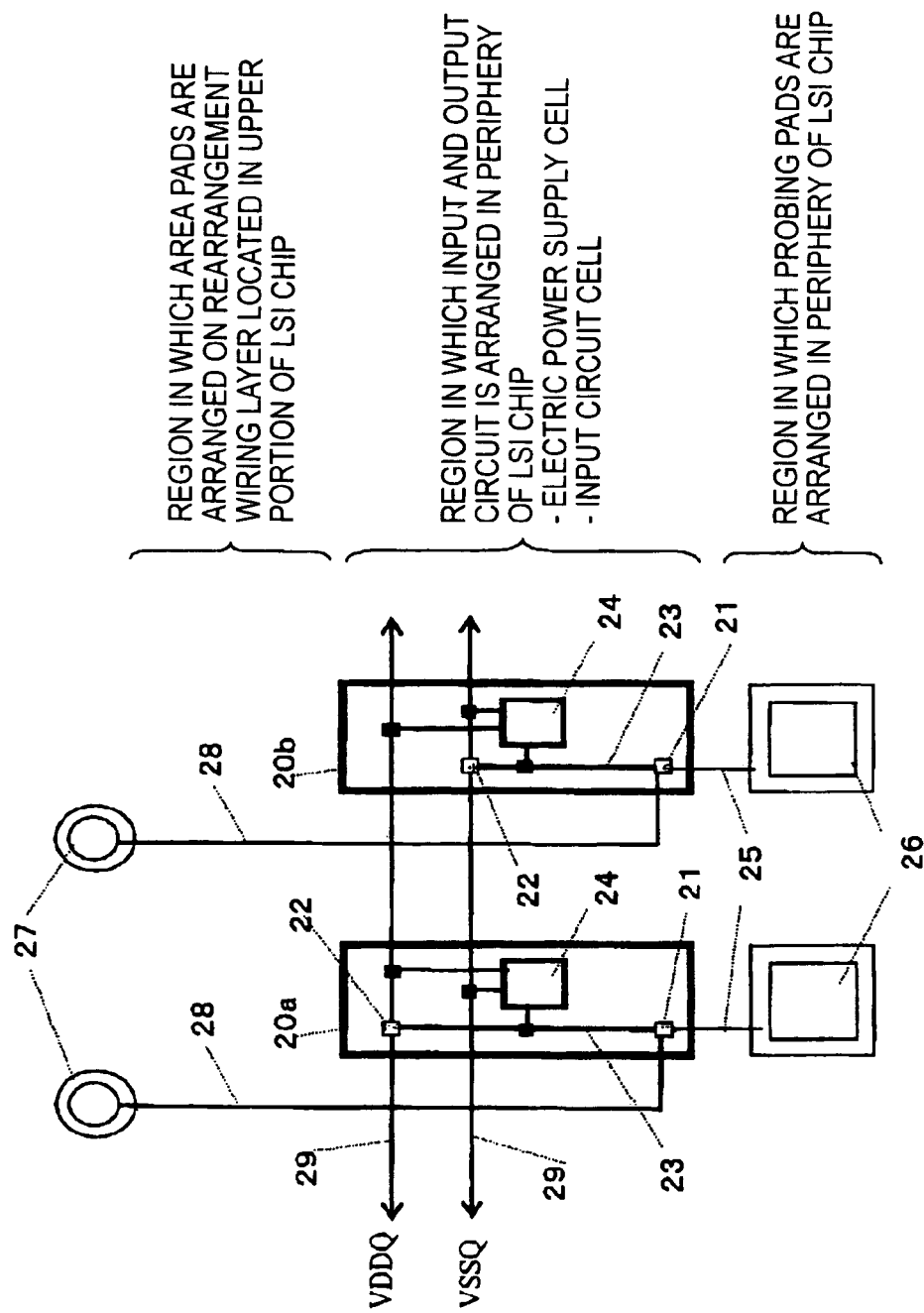
FIG. 8 is a view showing an outline of the conventional input and output circuit electric power supply cell.
Figure 9:
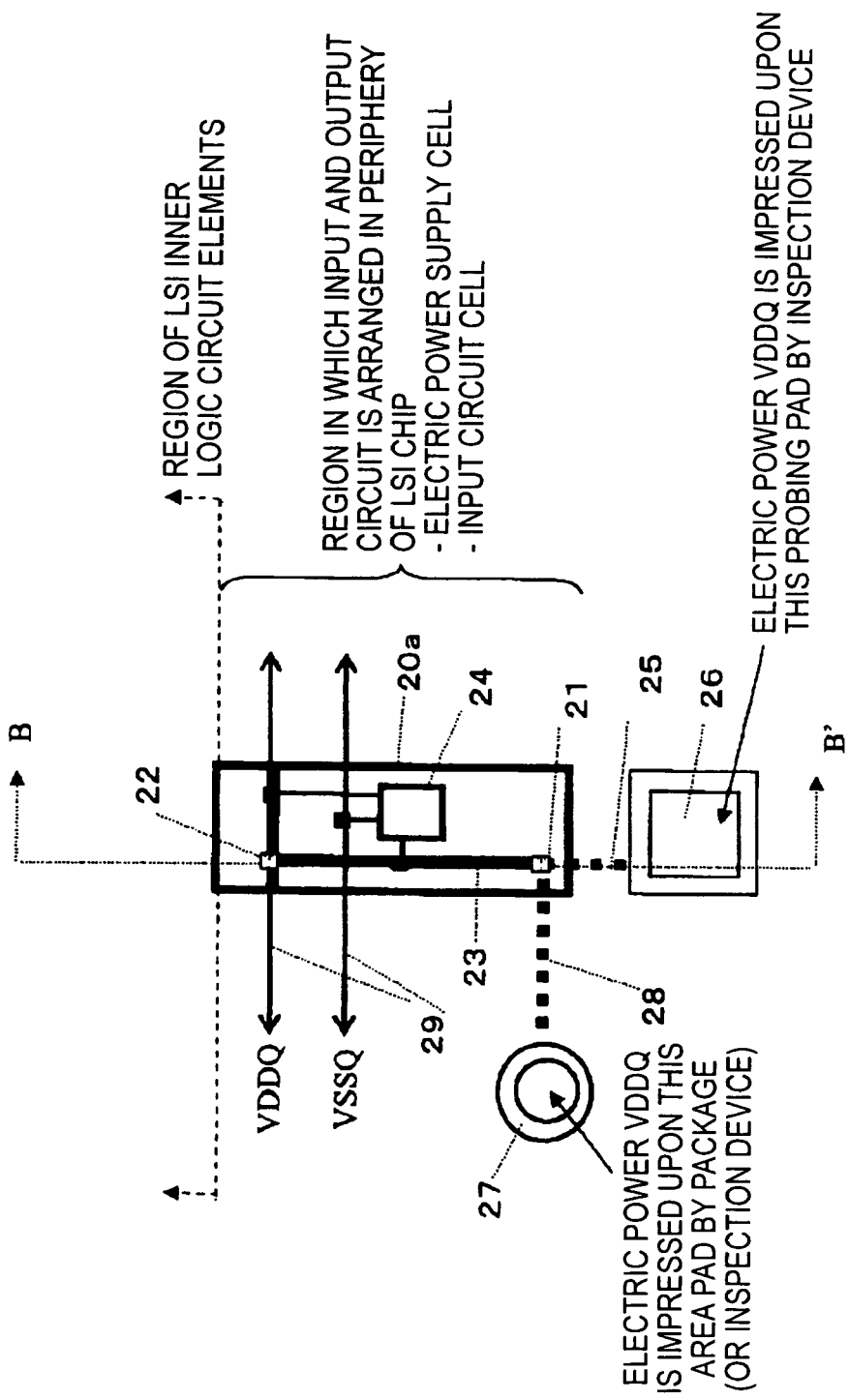
FIG. 9 is a view showing an outline of the conventional input and output circuit electric power supply cell.
Figure 10:
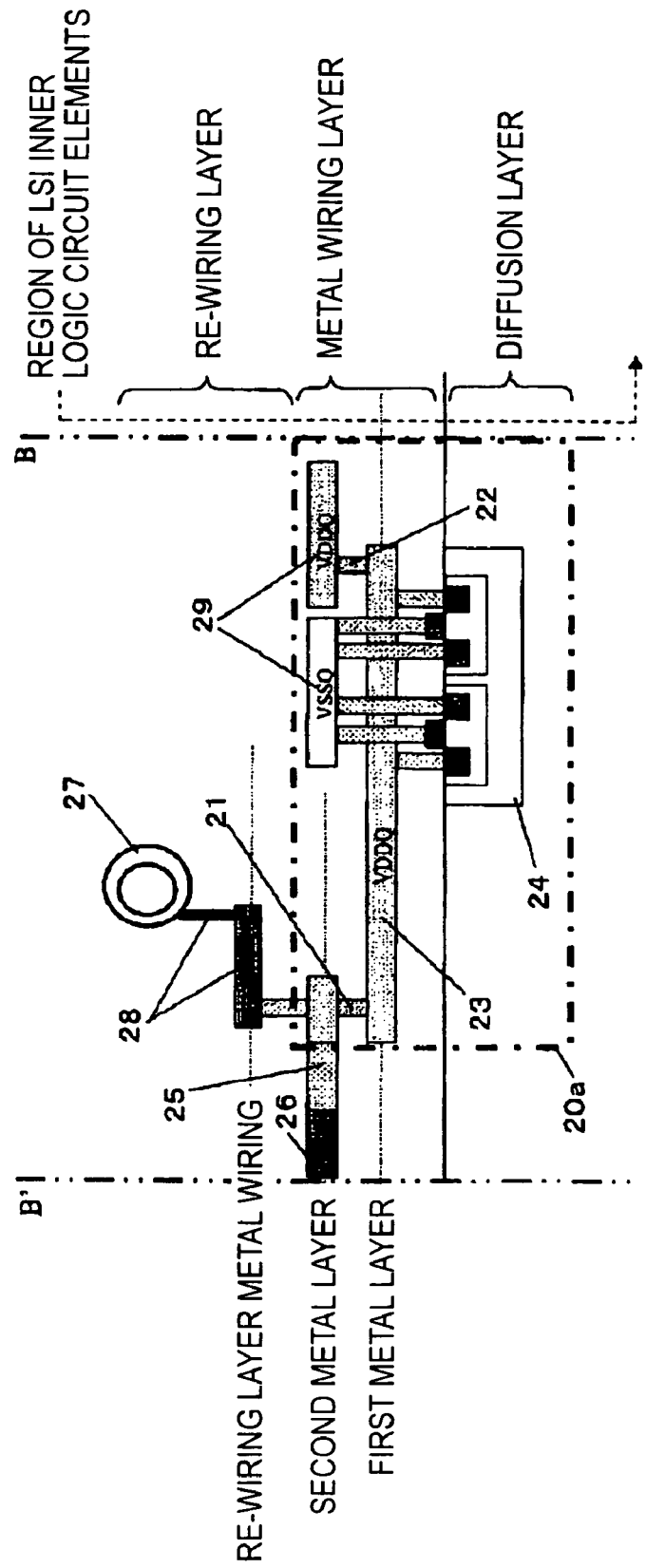
FIG. 10 is a view showing an outline of the conventional input and output circuit electric power supply cell.
Figure 11:
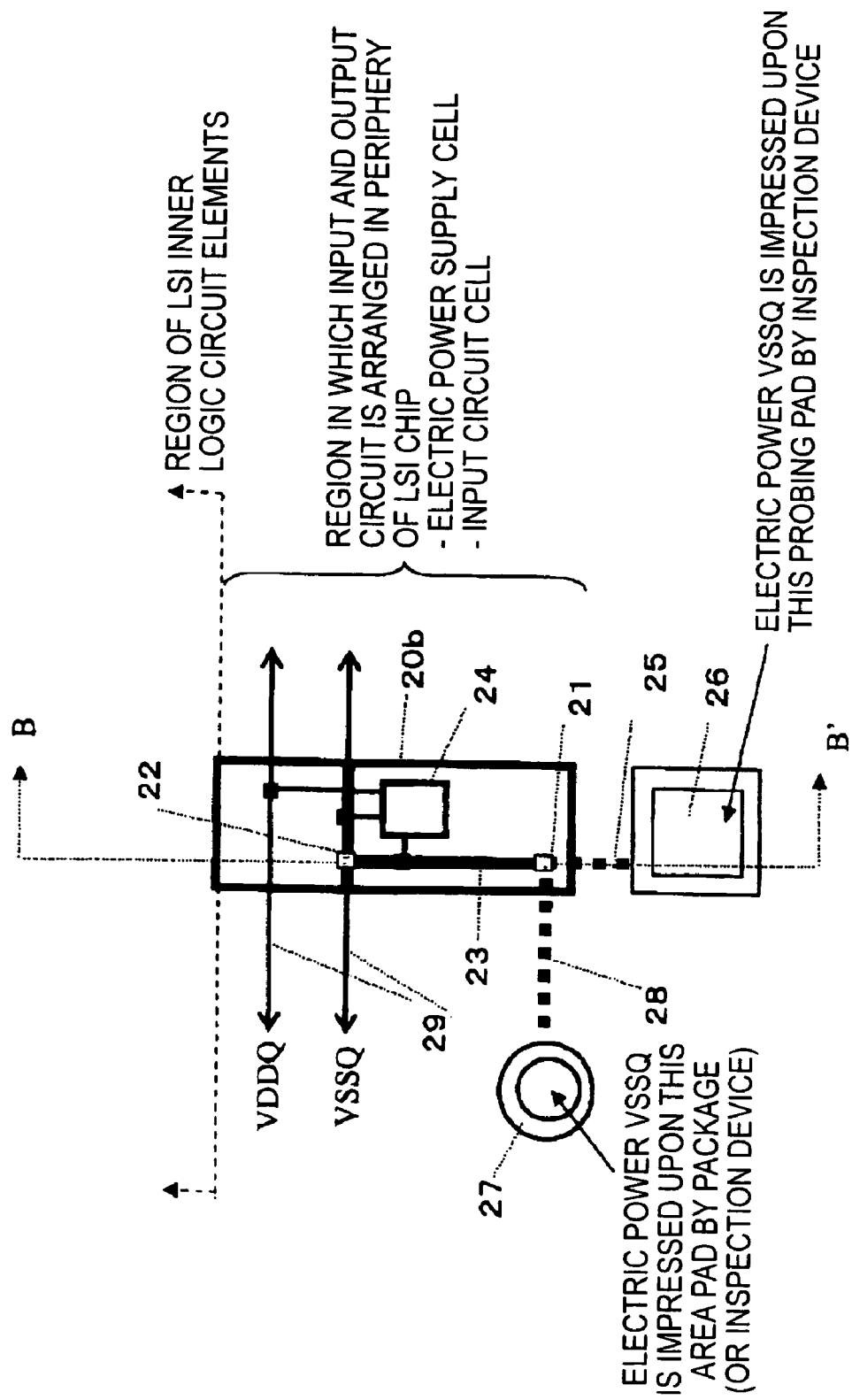
FIG. 11 is a view showing an outline of the conventional input and output circuit electric power supply cell.
Figure 12:
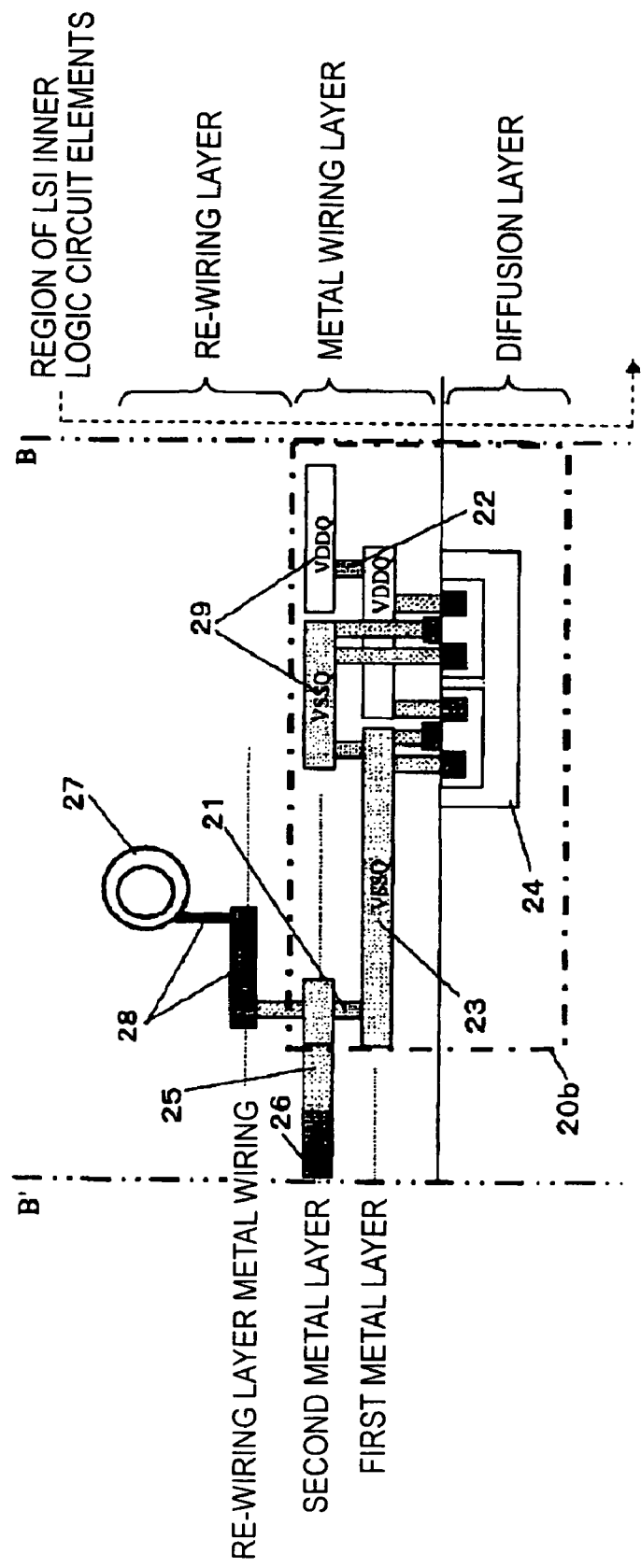
FIG. 12 is a view showing an outline of the conventional input and output circuit electric power supply cell.
Figure 13:
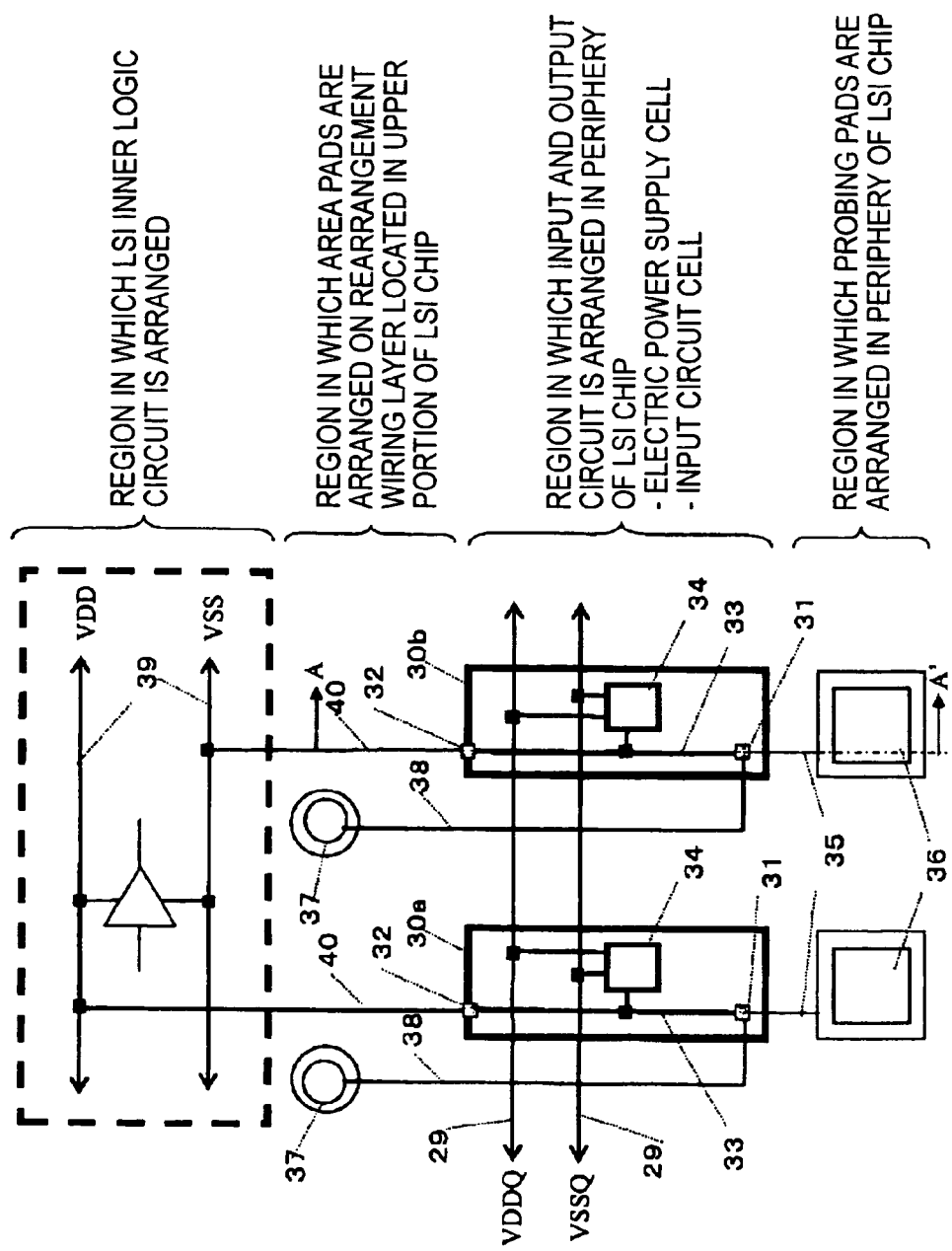
FIG. 13 is a view showing an outline of the conventional LSI inner logic circuit electric power supply cell.
Figure 14:
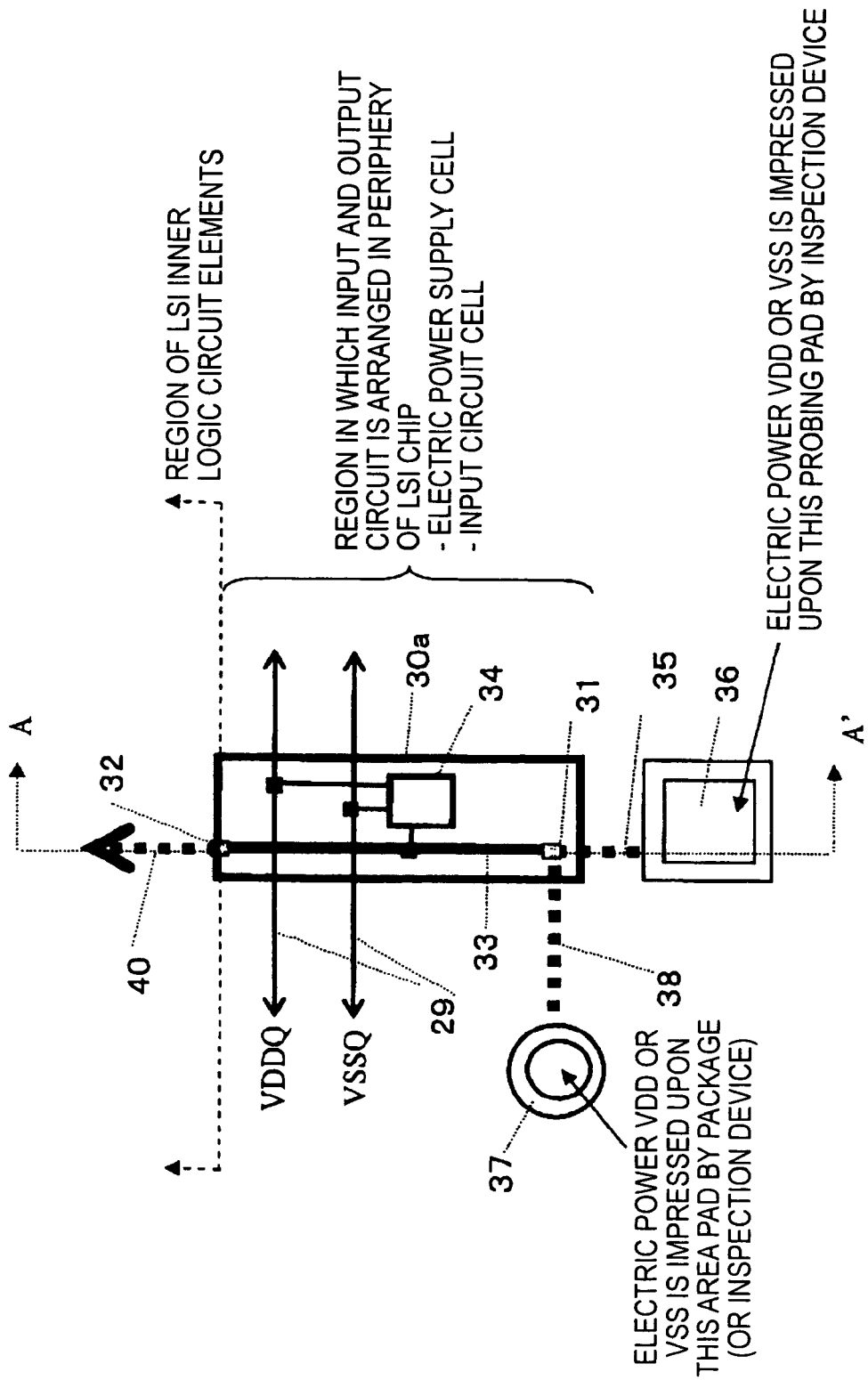
FIG. 14 is a view showing an outline of the conventional LSI inner logic circuit electric power supply cell.
Figure 15:
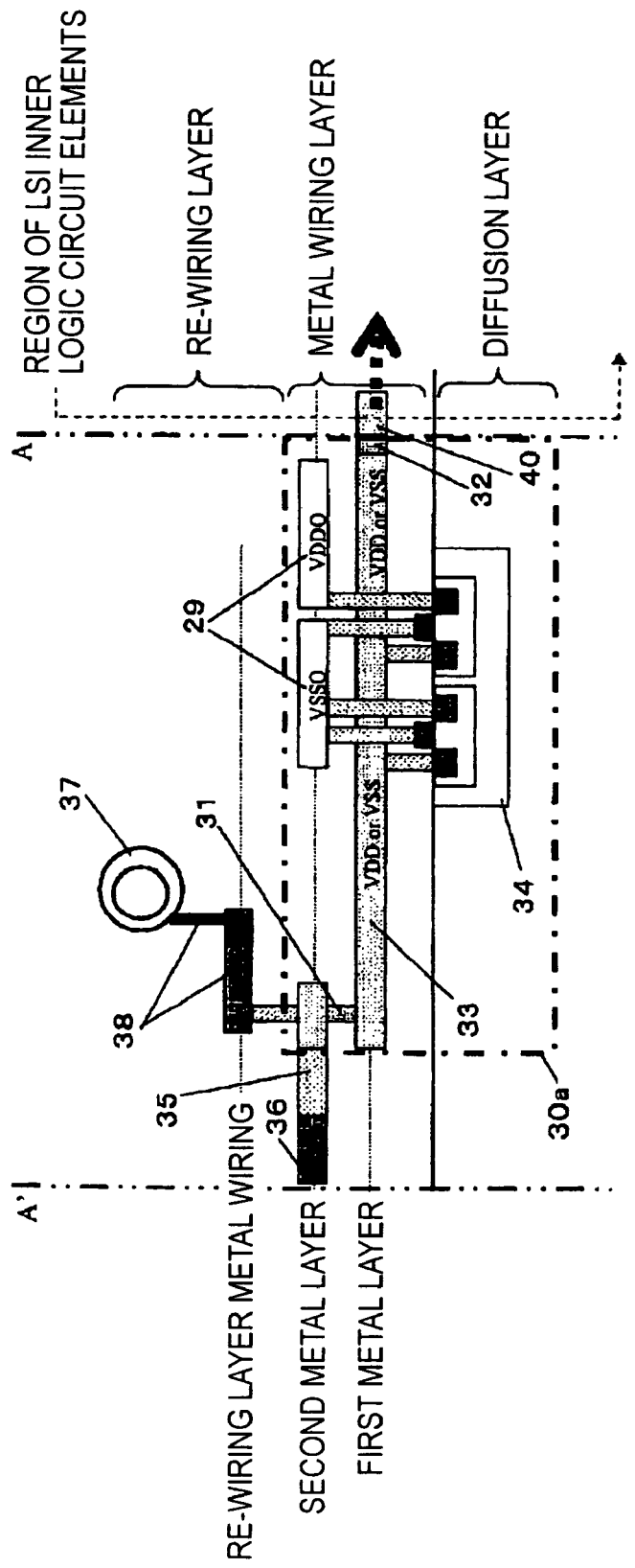
FIG. 15 is a view showing an outline of the conventional LSI inner logic circuit electric power supply cell.
Figure 16:
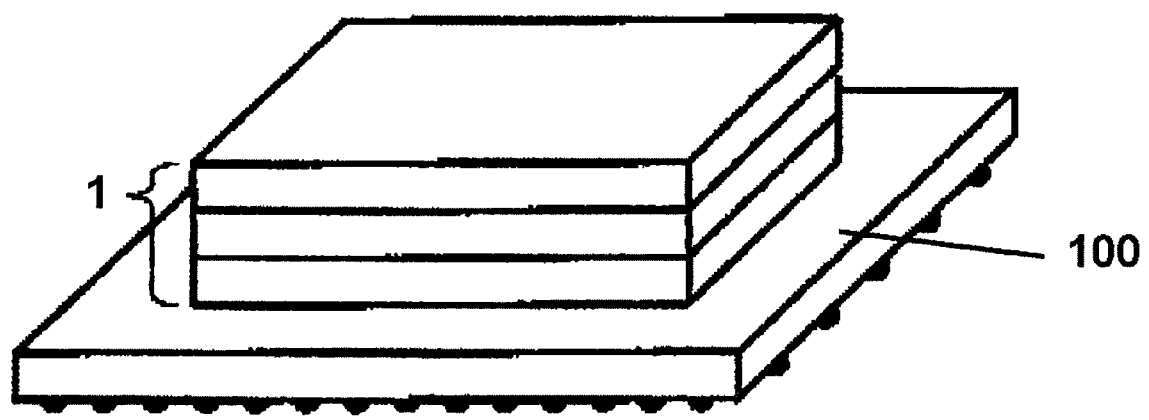
FIG. 16 is a view showing an LSI connected to a mounting board in a state of face-down.

As can be seen from the comparison with the conventional LSI chip shown in FIG. 7, according to the conventional example, since the different power source commonly used power supply cell 6S is arranged instead of the inner logic circuit electric power supply cell 6, two input and output circuit electric power supply cells 4 for taking in the inner logic circuit electric power source voltage from the area pads 7 are required, and two input and output circuit cells for supplying voltage from the input and output circuit electric power supply cell 4 to the inner logic circuit 5 via the inner logic circuit electric power supply cell 6 being protected from a surge are required. However, according to the embodiment of the present invention, the number of the components can be made to be one, that is, the number of the input and output circuit cells is reduced by one on each side of the chip.

This different power source commonly used power supply cell 6S will be specifically explained below.

The electric power source voltage used for the LSI chip is VDD and VSS for the inner logic circuit. The electric power source voltage used for the LSI chip is VDDQ and VSSQ for the inner logic circuit.

Figure 2:
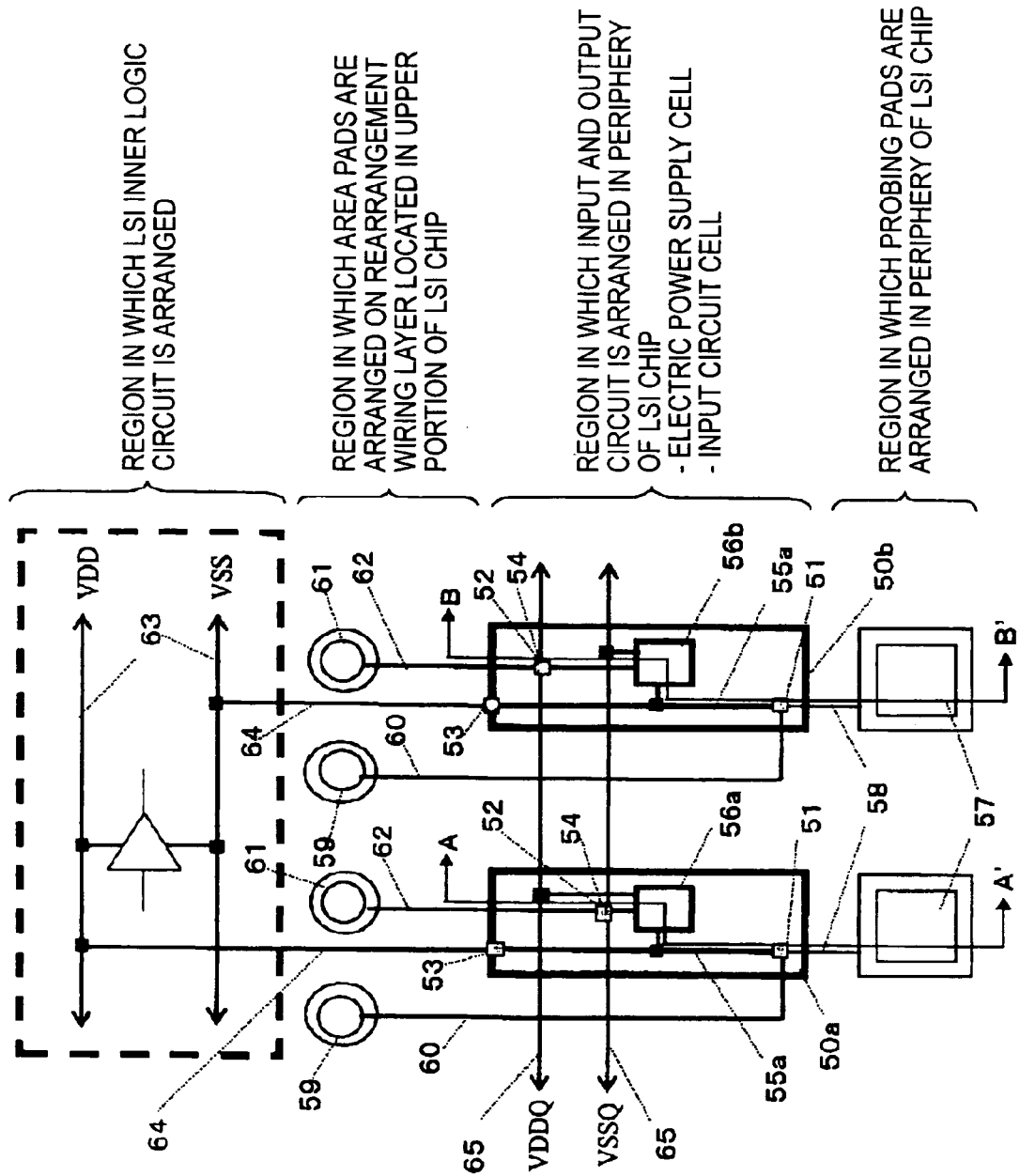
FIG. 2 is a view showing an outline of the different power source commonly used power supply cell of an embodiment.
Figure 3:
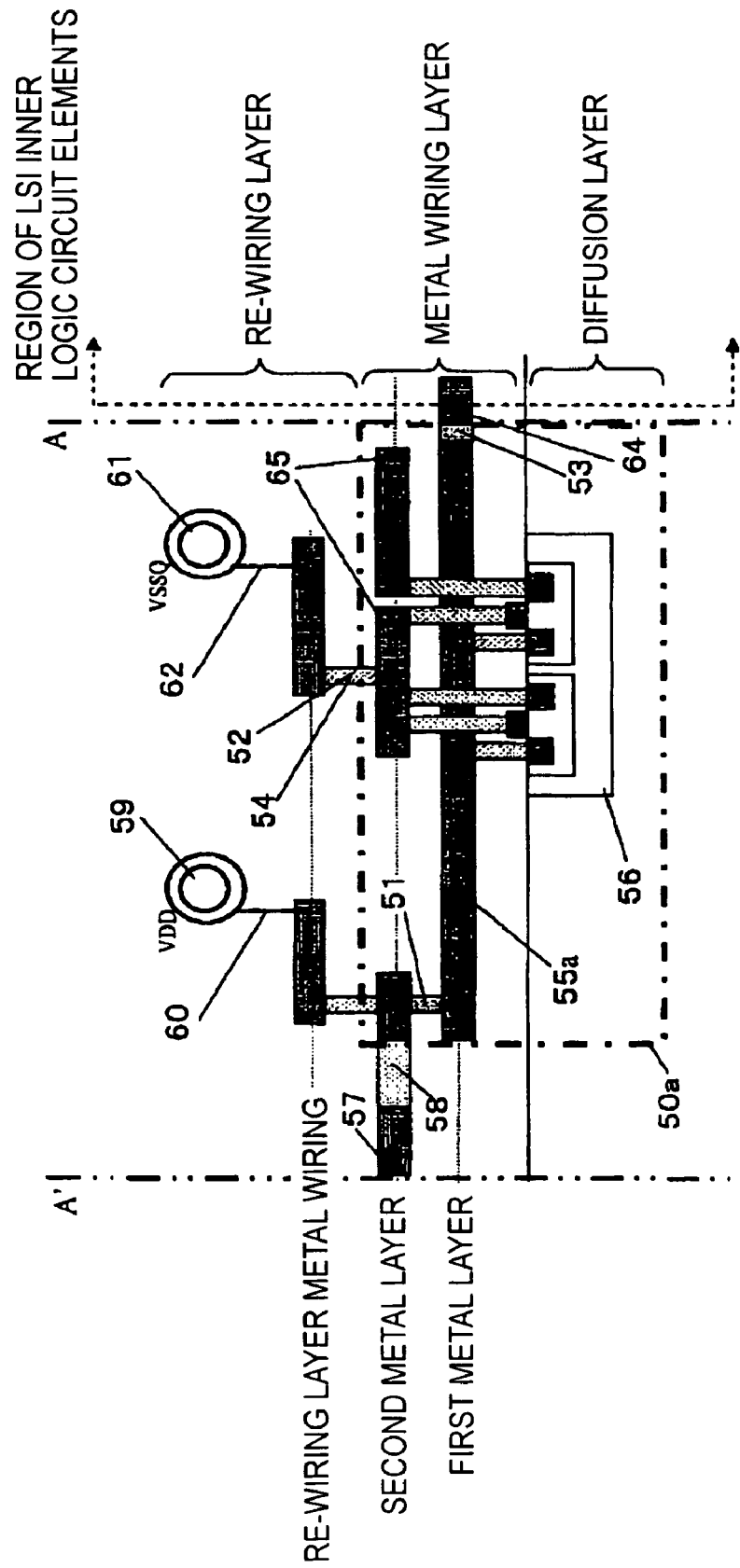
FIG. 3 is a sectional view taken on line A-A' of the different electric power source (VDD-VSSQ) commonly used electric power supply cell of an embodiment.

FIG. 2 is a view showing outlines of the different electric power source (VDD-VSSQ) commonly used electric power supply cell 50a and the different electric power source (VSS-VDDQ) commonly used electric power supply cell 50b. FIG.

Figure 4A:
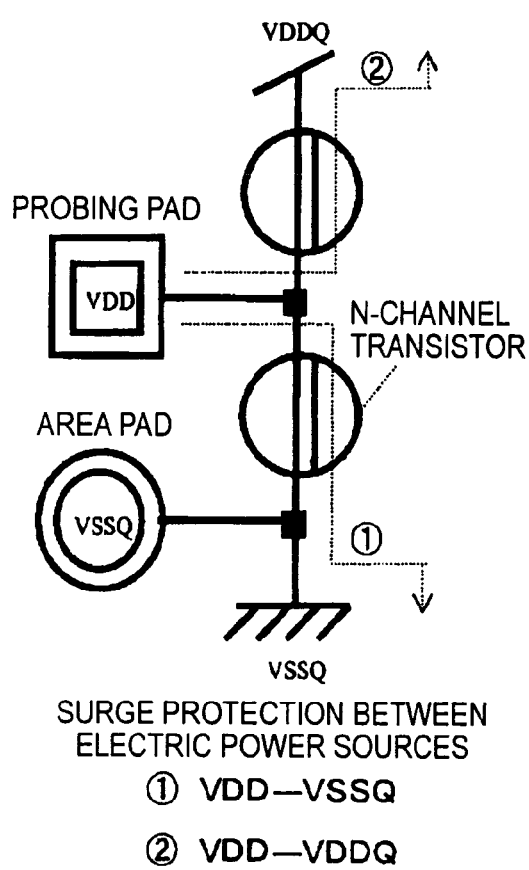
FIGS. 4A and 4B are views showing an outline of the surge protecting circuit for preventing a surge between electric power sources of the different electric power source (VDD-VSSQ) commonly used electric power supply cell of an embodiment.
Figure 4B:
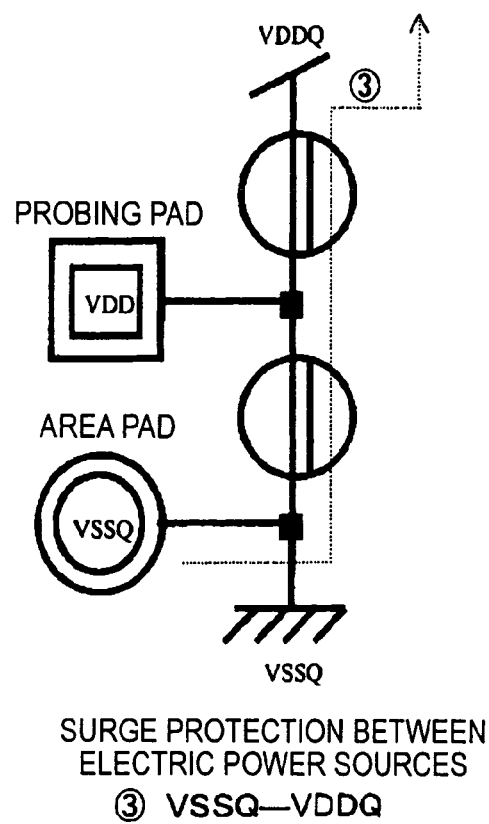

3 is a sectional view taken on line A-A' of the different electric power source (VDD-VSSQ) commonly used electric power supply cell 50a, and FIGS. 4A and 4B are views showing an outline of the surge protecting circuit.

Figure 5:
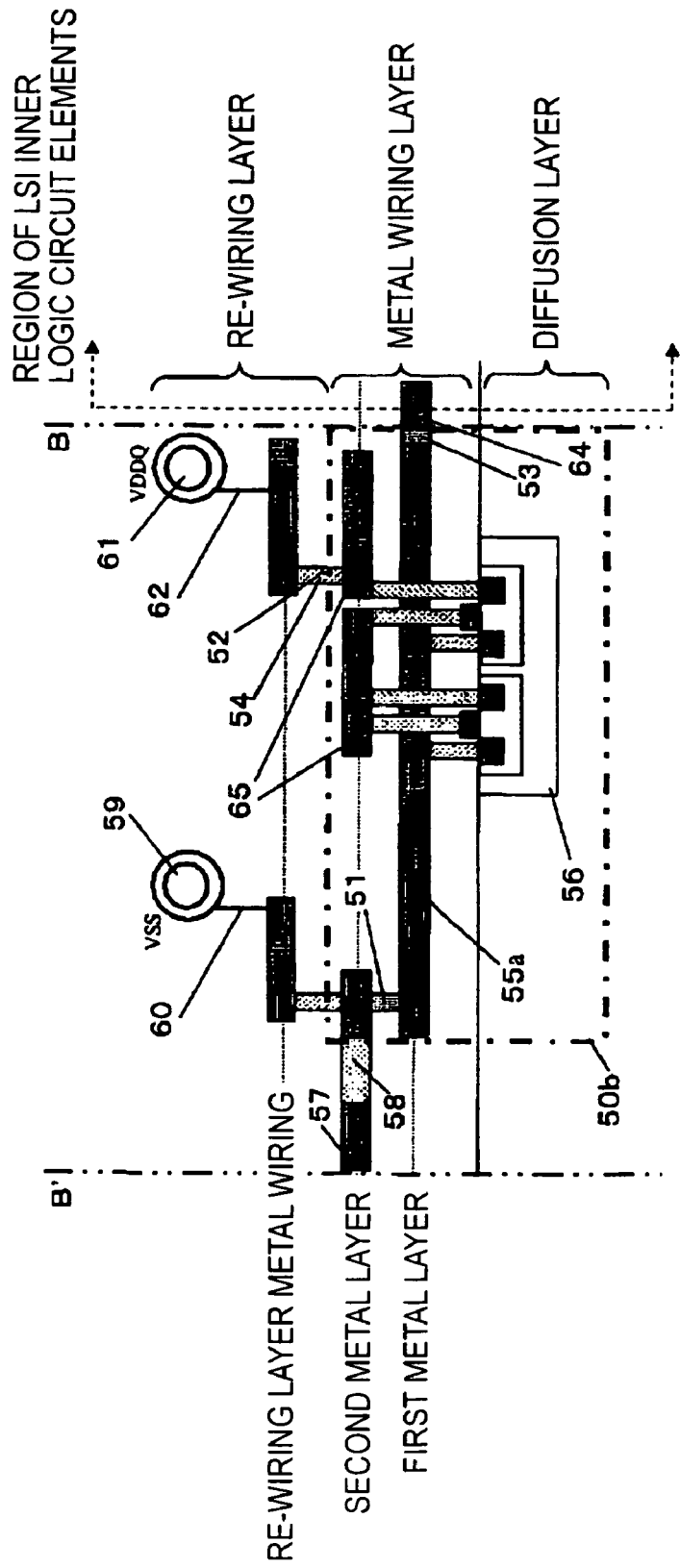
FIG. 5 is a sectional view taken on line B-B' of the different electric power source (VSS-VDDQ) commonly used electric power supply cell of an embodiment.
Figure 6A:
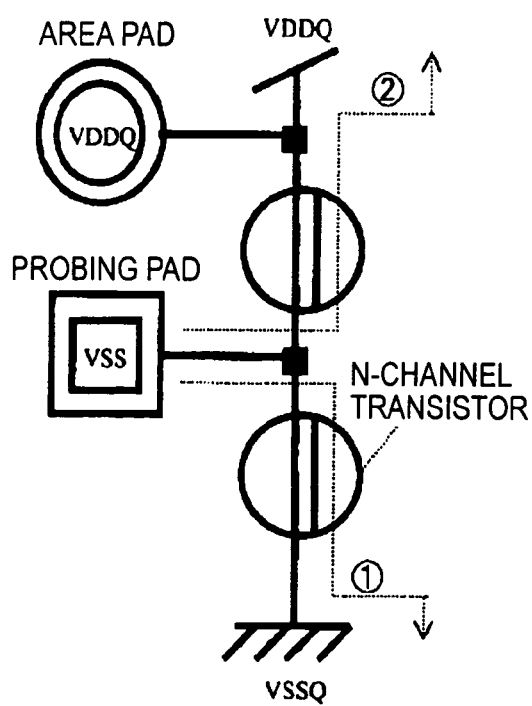
FIGS. 6A and 6B are views showing an outline of the surge protecting circuit between the electric power sources of the different electric power source (VSS-VDDQ) commonly used electric power supply cell of an embodiment.
Figure 6B:
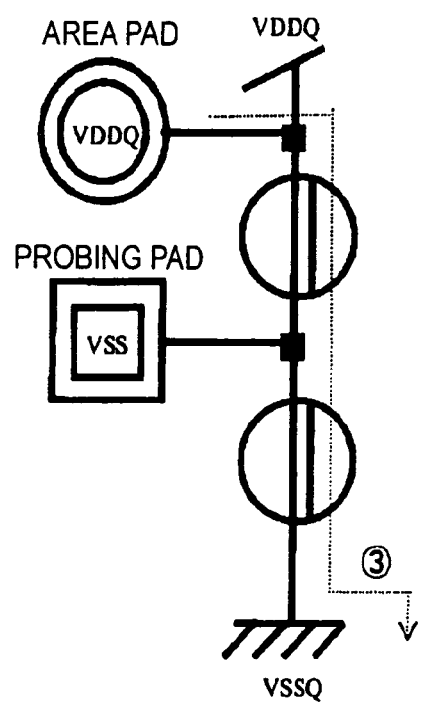

FIG. 5 is a sectional view taken on line B-B' of the different electric power source (VSS-VDDQ) commonly used electric power supply cell 50b shown in FIG. 2, and FIGS. 6A and 6B are views showing an outline of the surge protecting circuit.

Next, the constitution of and the mode of operation of the different power source commonly used power supply cell will be explained below.

Both the different power source commonly used power supply cells 50a and 50b includes: a first electric power input port 51, a second electric power input port 52, a first electric power supply port 53, a second electric power supply port 54, an electric power wiring 55a, and a surge protecting circuit 56 between the electric power sources. The first electric power input port 51 is connected to the probing pad 57 by the wiring 58 and also connected to the area pad 59 on the rearrangement wiring layer, which is located in an upper portion of the LSI chip, by the rearrangement wiring 60. The second electric power input port 52 is connected to the rearrangement wiring 62 by the area pad 61. The first electric power supply port 53 is connected to the LSI inner logic circuit electric power line 63 by the wiring 64. The second electric power supply port 54 is connected to the LSI periphery circuit electric power line 65 by the electric power wiring 55b in the cell. The LSI inner logic circuit electric power, which has been taken in from the probing pad 57, is supplied from the first electric power input port 51 to the LSI inner logic circuit electric power line 63, which is arranged in the periphery of the LSI inner logic circuit region periphery, via the electric power wiring 55a in the cell, the first electric power supply port 53 and the wiring 64. The LSI periphery circuit electric power, which has been taken in from the area pad 61, is supplied from the second electric power input port 52 to the LSI periphery circuit electric power line 65 via the second electric power supply port 54.

Next, the surge protecting circuit between the electric power sources will be explained below. FIG. 4A is a view showing an outline of the surge protecting circuit between the electric power sources of the different electric power source (VDD-VSSQ) commonly used electric power supply cell 50a. FIG. 4B is a view showing an outline of the surge protecting circuit between the electric power sources of the different electric power source (VDD-VSSQ) commonly used electric power supply cell 50a.

The different electric power source (VDD-VSSQ) commonly used electric power supply cell 50a shown in FIG. 5 protects between the LSI inner logic circuit electric power source VDD, which is impressed upon the probing pad, and the LSI periphery circuit electric power source VSSQ from a surge by the N-channel transistor. The different electric power source (VDD-VSSQ) commonly used electric power supply cell 50a shown in FIG. 5 also protects between the electric power source VDD and the LSI periphery circuit electric power source VDDQ from a surge by the N-channel transistor. The LSI periphery circuit electric power source VSSQ to be impressed upon the area pad and the LSI periphery circuit electric power source VDDQ are protected from a surge by the N-channel transistor. The circuit structure of this surge protecting circuit composed of this N-channel transistor is the same as that of the surge protecting circuit of the conventional LSI inner logic circuit VDD electric power supply cell, the surge protecting circuit being provided in the cell, and the circuit structure of this surge protecting circuit composed of this N-channel transistor is the same as that of the surge protecting circuit of the conventional LSI periphery circuit VSSQ electric power supply cell, the surge protecting circuit being provided in the cell. Therefore, VDD and VSSQ have the surge protecting circuit in common.

The different electric power source (VSS-VDDQ) commonly used electric power supply cell 50b shown in FIG. 5 protects between the LSI inner logic circuit electric power source VSS, which is impressed upon the probing pad, and the LSI periphery circuit electric power source VDDQ from a surge by the N-channel transistor. The different electric power source (VSS-VDDQ) commonly used electric power supply cell 50b shown in FIG. 5 also protects between the electric power source VSS and the LSI periphery circuit electric power source VSSQ from a surge by the N-channel transistor. The LSI periphery circuit electric power source VDDQ to be impressed upon the area pad and the LSI periphery circuit electric power source VSSQ are protected from a surge by the N-channel transistor.

Next, the surge protecting circuit between the electric power sources will be explained below. FIG. 6A is a view showing an outline of the surge protecting circuit between the electric power sources of the different electric power source (VSS-VDDQ) commonly used electric power supply cell 50b. FIG. 6B is a view showing an outline of the surge protecting circuit between the electric power sources of the different electric power source (VSS-VDDQ) commonly used electric power supply cell 50b shown in FIG. 5.

The circuit structure of this surge protecting circuit composed of this N-channel transistor is the same as that of the surge protecting circuit of the conventional LSI inner logic circuit VSS electric power supply cell, the surge protecting circuit being provided in the cell, and the circuit structure of this surge protecting circuit composed of this N-channel transistor is the same as that of the surge protecting circuit of the conventional LSI periphery circuit VDDQ electric power supply cell, the surge protecting circuit being provided in the cell. Therefore, VSS and VDDQ have the surge protecting circuit in common.

FIG. 1 is a view showing an outline of the flip chip LSI in which the different power source commonly used power supply cell of the present embodiment shown in FIG. 2 is used. Compared with the conventional layout shown in FIG. 7, the flip chip LSI shown in FIG. 1 is advantageous as follows. When the different power source commonly used power supply cell 6S, which is laid out by the same cell area as that of the input and output circuit electric power supply cell 4 and that of the LSI inner logic circuit electric power supply cell 6 shown in FIG. 1, is used, the number of the LSI periphery circuit elements 9 to be arranged can be reduced.

As described above, the semiconductor integrated circuit device of the present invention includes a plurality of electric power supply paths which respectively supply electric power, the electric potentials of which are different from each other, in such a manner that electric power taken in from the area pad is supplied to the LSI periphery circuit element in the case of operating a product and in the case of inspecting a finished product and that electric power taken in from the probing pad is supplied to the LSI inner logic circuit in the case of a probing inspection. Further, the surge protecting circuit between the electric power sources is used in common. Due to the foregoing, the number of the electric power supply cells arranged in the LSI periphery circuit, which are arranged for each electric power supply to be supplied to the input and output circuit and the LSI inner logic circuit, can be reduced and the area of the entire semiconductor chip can be reduced.

According to the present invention, the input and output circuit electric power supply cell, which is arranged for supplying electric power to the input and output circuit not operated in the case of a probing inspection, is replaced with the different power source commonly used power supply cell. Therefore, in the case of a probing inspection, electric power is supplied from the probing pad via this input and output circuit, and the number of the electric power supply paths to the LSI inner logic circuit can be increased. Accordingly, an influence of the IR drop given to the logic circuit can be deduced, and the inspection accuracy of the probing inspection can be enhanced.

In this connection, in the above embodiment, the electric power supply to the input and output cells is changed over according to whether electric power is supplied from the probing pad or the area pad. However, the electric power supply to the input and output cells may be changed over when a plurality of area pads or a plurality of probing pads are connected to the input and output cells.

The changeover means can be appropriately changed over.

According to the present invention, it is possible to prevent the chip area from increasing when the LSI periphery circuit elements are arranged. An influence given by the IR drop can be reduced by increasing the number of electric power supply paths to the LSI inner logic circuit in the case of a probing inspection. Accordingly, the inspection accuracy in the case of inspecting a finished produce can be enhanced.

The present invention is not limited to the embodiments and the description thereof at all. If various changes which can be easily conceived by those skilled in the art are not departed from the description of the scope of claim, they may be contained in the present invention.

What is claimed is:

1. A semiconductor integrated circuit device, comprising:
   an inner logic circuit for operating with a first electric power source voltage;
   an input and output circuit of the inner circuit for operating with a second electric power source voltage;
   a first voltage line for providing the first electric power source voltage;
   a second voltage line for providing the second electric power source voltage; and
   a power source voltage supply circuit for supplying the first electric power source voltage for the inner logic circuit and the second electric power source voltage for the input and output circuit,
   wherein the power source voltage supply circuit comprises:
      a first input section for inputting the first electric power source voltage from the first voltage line,
      a second input section for inputting the second electric power source voltage from the second voltage line,
      a first output section for outputting the first electric power source voltage to the inner logic circuit,
      a second output section for outputting the second electric power source voltage to the input and output circuit, and
      a surge protection circuit for protecting the inner logic circuit and the input and output circuit from surge voltage of the first electric power source voltage and the second electric power source voltage, which is connected to the first input section and the second input section.

2. A semiconductor integrated circuit device according to claim 1, wherein, when a surge voltage of the first electric power source voltage or the second electric power source voltage occurs, the surge protection circuit protects the inner logic circuit or the input and output circuit from the surge voltage by discharging electricity from one of the first input section or the second input section to another.

3. A semiconductor integrated circuit device according to claim 2, wherein the surge protection circuit comprises a transistor whose source is connected to one of the first input section and the second input section and drain is connected to another.

4. A semiconductor integrated circuit device according to claim 1, wherein the semiconductor integrated circuit device is an LSI, on the surface of which a rearrangement wiring is provided, which is connected to a mounting board in a state of face-down.

5. A semiconductor integrated circuit device, comprising:
   an inner logic circuit for operating with a first electric power source voltage;
   an input and output circuit of the inner circuit for operating with a second electric power source voltage;
   a first voltage line for providing the first electric power source voltage, the first voltage line is a probing voltage line for a probing test of the inner logic circuit;
   a second voltage line for providing the second electric power source voltage, the second voltage line is a terminal voltage line for providing the second electric power source voltage, the second electric power source voltage is a driving voltage for the input and output circuit; and
   a power source voltage supply circuit for supplying the first electric power source voltage for the inner logic circuit and the second electric power source voltage for the input and output circuit,
   wherein the power source voltage supply circuit comprises:
      a first input section for inputting the first electric power source voltage from the first voltage line,
      a second input section for inputting the second electric power source voltage from the second voltage line,
      a first output section for outputting the first electric power source voltage to the inner logic circuit,
      a second output section for outputting the second electric power source voltage to the input and output circuit,
      a surge protection circuit for protecting the inner logic circuit and the input and output circuit from surge voltage of the first electric power source voltage and the second electric power source voltage, which is connected to the first input section and the second input section, and
   the semiconductor integrated circuit device is arranged around the inner logic circuit in the same manner as the input and output circuit.

* * * * *